United States Patent [19]
Pascucci

[11] Patent Number: 5,821,806
[45] Date of Patent: Oct. 13, 1998

[54] BOOST REGULATOR

[75] Inventor: Luigi Pascucci, Sesto San Giovanni, Italy

[73] Assignee: SGS-Thomson Microelectronics Srl., Agrate Brianza

[21] Appl. No.: 787,494

[22] Filed: Jan. 21, 1997

[30] Foreign Application Priority Data

Jan. 24, 1996 [EP] European Pat. Off. .............. 96830026

[51] Int. Cl.⁶ ....................................................... G05F 1/10
[52] U.S. Cl. ........................................... 327/538; 327/543
[58] Field of Search .................................... 327/530, 534, 327/535, 537, 538, 540, 541, 543, 205, 319, 333; 323/312, 313, 314, 315

[56] References Cited

U.S. PATENT DOCUMENTS

| | | | |
|---|---|---|---|
| 5,495,453 | 2/1996 | Wociechowski et al. ......... | 364/185.18 |
| 5,559,717 | 9/1996 | Tedrow et al. ............................. | 364/483 |
| 5,742,197 | 4/1998 | Kim et al. ................................ | 327/537 |
| 5,954,990 | 9/1990 | Vider ....................................... | 365/185 |

*Primary Examiner*—Toan Tran
*Assistant Examiner*—Jeffrey Zweizig
*Attorney, Agent, or Firm*—Allen, Dyer, Doppelt, Milbrath & Gilchrist, P.A.

[57] ABSTRACT

A regulator circuit of the output voltage produced by a voltage boost circuit, capable of generating a hysteretic control logic signal of the boost circuit, comprises a sensing branch comprising at least an inverting stage including an enhanced threshold load transistor of a first type of conductivity and a complementary natural transistor, and a nonvolatile memory element functionally connected in series with the complementary inverting stage between the two supply nodes. A biasing branch, enabled by a start signal of the boost circuit, generates a first voltage higher than the threshold voltage of the load transistor, and a second voltage higher than the threshold voltage of the natural transistor. A circuit portion enabled by the start signal applies to a control terminal of the nonvolatile memory element a voltage representative of the regulated output voltage produced by the boost circuit. One or more inverters are coupled in cascade to the inverting stage to produce the required logic signal.

14 Claims, 2 Drawing Sheets

BOOST REGULATOR

FIELD OF THE INVENTION

The present invention relates in general to nonvolatile memories functioning at a relatively low voltage, and using integrated boost circuits for generating the required biasing bias voltages for the memory cells generally higher than the supply voltage, or in any case, decoupled from the supply voltage, and, more particularly, to a regulator circuit of the voltage produced by the boost circuits.

BACKGROUND OF THE INVENTION

The quest for a higher and higher scale of integration through a reduction in size of the scaleable features of integrated structures, the reduction of power consumption, as well as the development of battery powered portable apparatuses, have promoted a constant reduction of the nominal supply voltage of integrated devices. There are however "nonscaleable" features or parameters, such as, for example, the threshold voltages of active integrated components. Particularly, in the field of nonvolatile or read only memories as, for example, the so-called EPROM, EEPROM, FLASH memories and the like, the stimulation voltages of the nonvolatile memory cells during the erasing, programming and reading phases are generally higher than the nominal supply voltage of the device. In all these cases it is necessary to use dedicated boost or charge pump circuits for locally generating the boosted voltages required to adequately bias the memory cells during the various phases of operation.

Of course, the voltage boosting elevator circuit, usually provided by a common charge pump circuit, must be driven in a controlled manner for regulating the boosted voltage, as generated by a multiplier circuit, within a certain tolerable range of variation. Though reference is being made to the generation of a boosted voltage, higher than the supply voltage, it is evident that the voltage produced by the boost circuit may also be regulated to a value lower than the supply voltage, and the considerations made herein should not be understood as limited to such a common case for generating a boosted voltage.

Whichever the case, such a control is commonly exercised in a hysteretic mode and, according to a well known technique, requires the integration of a resistive voltage divider through which the instantaneous value of the produced voltage is monitored. The voltage regulation loop may be realized by employing a comparator that compares the output voltage with a reference value, followed in cascade by one or more CMOS inverters, thus to produce a digital hysteretic control signal for the charge pump circuit.

This technique has various disadvantages. A first disadvantage is that despite the fact that the comparators and the inverters of the regulation loop are obviously powered by the supply voltage source of the integrated circuit, the output monitoring voltage divider constitutes a "load" of the boosted voltage line because it continuously absorbs energy from the line itself. A second disadvantage is that during the design stage, the voltage regulation value must be fixed and such a determination remains at best a compromise derived from an estimate of the average value and of the process spread of the significative electrical parameters of the memory cells (threshold voltages, thickness of the dielectric etc.).

SUMMARY OF THE INVENTION

Confronted with these difficulties, a circuit has now been found that regulates the output voltage produced by a charge pump, voltage boosting circuit, capable of generating a logic control signal of the charge pump circuit, that substantially eliminates the absorption of energy from a sensing voltage divider of the regulated output voltage and through which, the actual regulation value is in practice determined by the real electrical characteristics of the nonvolatile memory cells. Therefore, the circuit of the invention provides, in an extremely effective way, a substantial independence from the value of the supply voltage, carrying on the regulation in an optimized manner by relying on the real electrical characteristics of the integrated devices.

Fundamentally, the regulation circuit of the invention is based on a structure that, under certain aspects, may be considered as the structure of a sense amplifier which employs as comparison of "discrimination" a memory element entirely similar to the cells of the memory matrix. This essentially close structural identity can be accentuated by using as the discrimination memory element, a geometrically "internal" cell of a minuscular matrix of elementary cells, which, being fabricated contextually to the memory matrix, shares all the peculiarities and characteristics imparted by the fabrication process.

Essentially, the regulating circuit of the invention comprises a sensing branch comprising at least a complementary stage including a load transistor of a first type of conductivity, and by a complementary natural transistor, that is, having a substantially uncorrected threshold, coupled between the supply rail and a nonvolatile memory element whose second current terminal is coupled to ground. Essentially the circuit further comprises a biasing line or branch of the active elements of the sensing branch, which generates a first voltage surely higher than the threshold voltage of the load transistor of the complementary stage, and a second voltage surely greater than the threshold voltage of the natural complementary transistor of the inverting stage.

The circuit further comprises circuit elements capable of feeding to a control terminal of the nonvolatile memory element that is functionally coupled in series with the complementary stage, a voltage representative of the regulated output voltage produced by the charge pump circuit. In practice, the regulated output voltage that is effectively applied to the cells of the memory matrix is "sensed" by the nonvolatile memory element of the regulating circuit, thus substantially eliminating any current absorption from the boosted line.

As mentioned above, the nonvolatile memory element of "discrimination" may be provided by an elementary memory cell practically identical to the elementary cells of the memory matrix. Therefore the memory cell is capable of discriminating information on the real instantaneous value of the regulated output voltage produced by the boost circuit in terms of the real biasing effect thereof on the nonvolatile memory cells, therefore on information that is intrinsically tied to the real electrical characteristics of the memory cells themselves. Therefore, the discrimination performed by the regulating circuit perfectly complies with the essential requisite of ensuring the provision of a correct bias of the memory cells, and such a discrimination is intrinsically free of any reference level shifting error due to a multiplication phenomenon that tends to manifest itself when generating dedicated reference voltages within the device itself.

BACKGROUND OF THE INVENTION

The various aspects and advantages of the invention will become even clearer through the following description of some important embodiments and by referring to the attached drawings, wherein:

FIG. 1 is a basic scheme of the voltage regulation circuit of the invention; and FIG. 2 is a more detailed diagram of a practical embodiment of the invention.

BRIEF DESCRIPTION OF THE DRAWINGS

By referring to FIG. 1, the regulation circuit of the invention comprises a sensing circuit or branch that includes a complementary stage provided by a p-channel load transistor M1 and a natural n-channel transistor M2nat, and a nonvolatile memory element MM1 electrically connected in series with the complementary stage, between the two supply nodes. A biasing circuit or branch, which may be enabled by the start command signal REGup of the boost circuit through the n-channel switch M3, is provided by a diode-configured, natural p-channel transistor M4nat that generates a first bias voltage VTPnat that is surely higher than the threshold voltage of the load transistor M1 of the complementary stage of the sensing branch, and a diode-configured n-channel transistor M5, that generates a second bias voltage VTN that is surely higher than the voltage threshold of the natural transistor M2nat of the complementary stage.

The block ELEVATOR represents a noninverting level shifting circuit that, when enabled by the command signal REGup, causes the application to the control terminal of the nonvolatile memory cell MM1 of a voltage representative of the regulated output voltage produced by the boost circuit, that is, of the voltage that is effectively applied to the control terminal of the matrix cells, while eliminating any static consumption or any current absorption from the boosted voltage line produced by the relative charge pump circuit. The analog state of the output node DET of the inverting stage provided by the pair of complementary transistors M1 and M2nat is determined by a balance or unbalance condition between the current that flows in the p-channel transistor M1 and the current that flows in the memory cell MM1. Therefore, depending on the real characteristics of conductivity of the memory cell MM1, the circuit regulates the level of the CGreg voltage that is applied to the control gate of the cell MM1 and which is derived from the boosted voltage Vboost produced by the charge pump circuit, until reaching a condition of balance. In other words, the regulated voltage Vboost produced by the charge pump circuit will be automatically increased until the current carried by the memory cell MM1 equals the current carried by the p-channel transistor M1.

Figure 1:
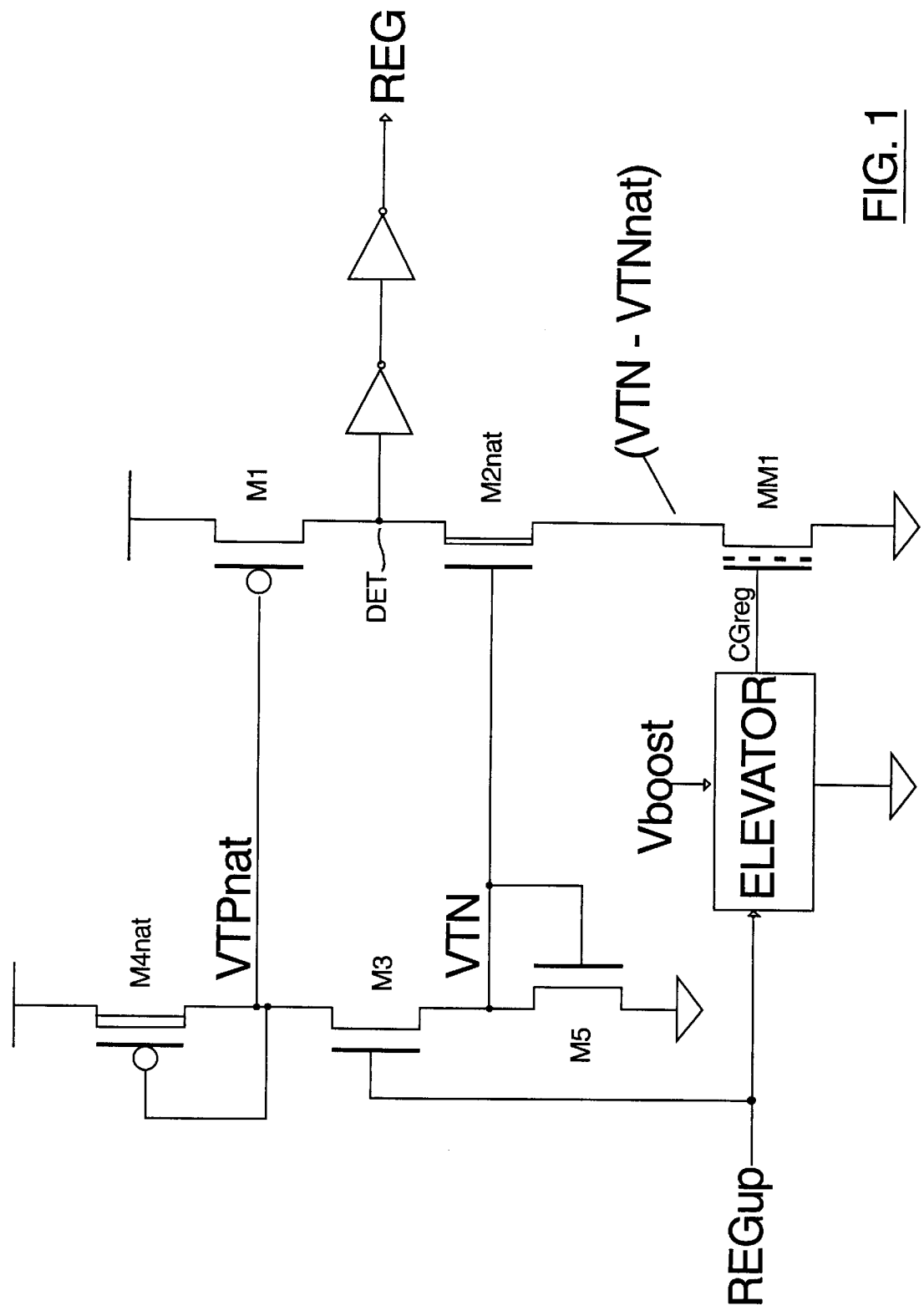

In addition, as it can be easily observed, the current carried by the p-channel transistor M1 is determined by the difference between the electric characteristics of the p-channel transistor M1 itself and the natural p-channel transistor (that is having a high threshold value) M4nat of the biasing branch. Being the same type of transistors also used in the reading circuits (sense amplifiers) of the memory, the regulated level of the boosted voltage Vboost produced by the respective charge pump circuit and thence of the bias condition of the control gate of the memory cells, ensures ideal working conditions of the sense amplifiers under all circumstances because the real electrical characteristics of the devices are accounted for. Therefore, the analog state of the output node DET is established by a general "matching" of the conductivity state of the MM1 cell, that is of the memory cells in general and of p-channel transistors.

One or more buffer stages provide a logic regulation signal REG that hysteretically controls the boost circuit, when driven into operation by the command REGup.

Therefore, when the regulating circuit operates, the biasing branch, M4nat, M3 and M5, produces a first voltage VTPnat that stably biases the p-channel load transistor M1 of the sensing branch, and a second voltage VTN that fixes more and more stably, that is, in a noncritical way, the potential on the drain node of the nonvolatile memory element of discrimination MM1 at a level corresponding to the difference between the threshold voltage of the enhancement type n-channel transistor and the threshold voltage of the natural or low threshold n-channel transistor (VTN-VTNnat).

This bias condition of the drain node of the nonvolatile memory element of discrimination MM1 produces several important advantages. Firstly, this condition reduces bias the level of the drain node, thus preventing sensible variation of the cell's conductivity characteristics. Moreover, this condition of relatively low drain bias, determines a relatively low current working condition and therefore a low consumption regulation process. Finally, in view of the fact that this difference between threshold voltages remains substantially constant upon temperature changes, a good stability toward temperature changes of the regulation performed by the circuit is ensured. The circuit ELEVATOR is designed for applying the regulated output voltage produced by the relative charge pump circuit to the control gate of the nonvolatile memory cell of discrimination MM1.

The sensing branch enabled and biased as described above, produces on its output node DET an analog level that tracks the conductivity state of the load transistor M1 and of the nonvolatile memory cell MM1. The output buffer chain produces a logic signal REG equal to "1", if the nonvolatile memory cell MM1 is insufficiently conductive, that is, when the regulated boosted voltage applied to its control terminal CGreg is too low. The output buffer chain produces a logic signal REG equal to "0", if the conductivity of the memory cell MM1 is sufficiently high, thus confirming an adequate value of the regulated boosted output voltage (Vboost).

Figure 2:
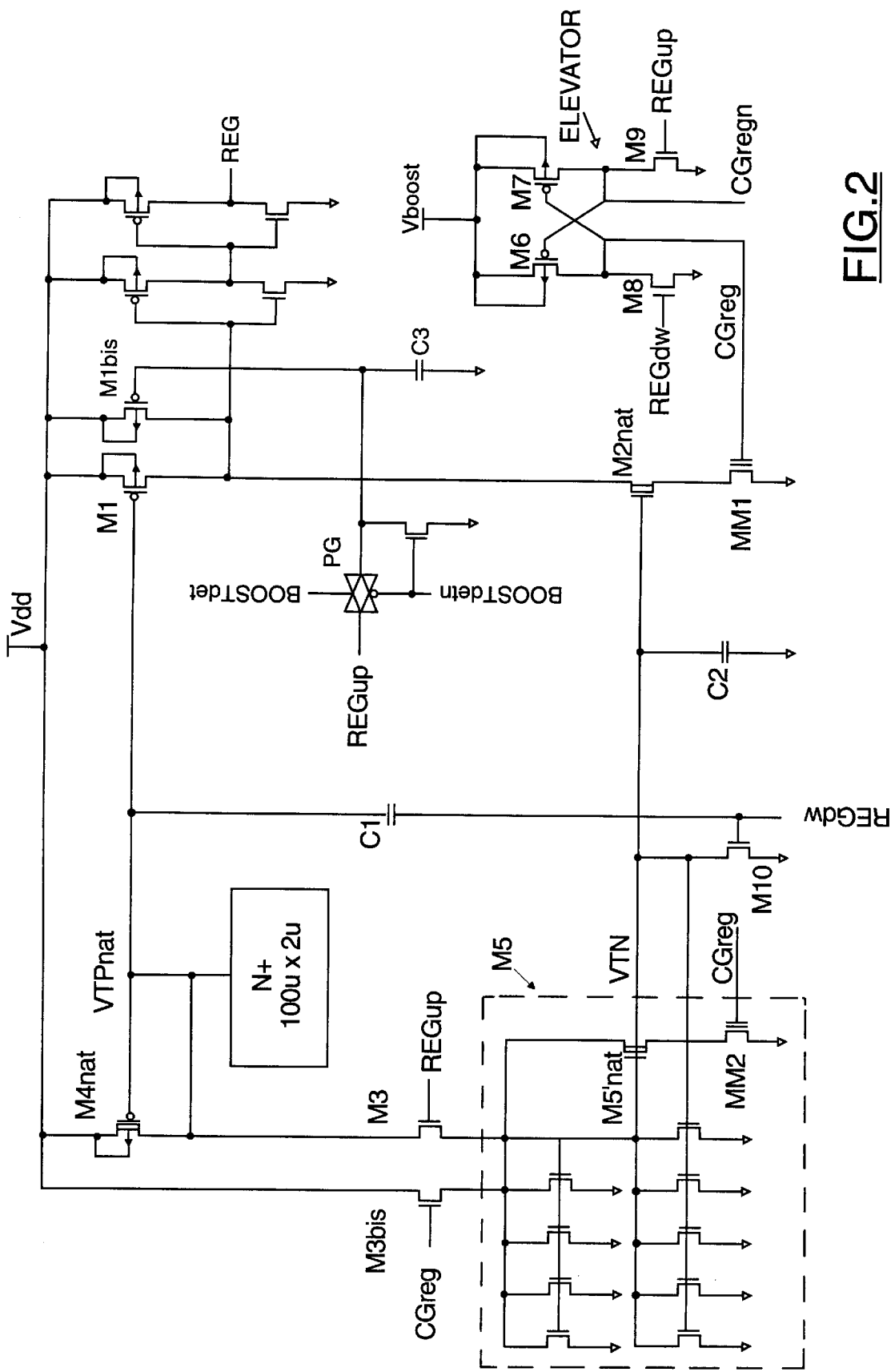

A particularly effective practical embodiment of the circuit of the invention is shown in FIG. 2. In the scheme of FIG. 2, REGup represents the start-up or enabling command of the boost circuit, whereas REGdw represents the disabling or stop command of the boost circuit. REG is the hysteretic (ON/OFF) control signal produced by the regulating circuit. The signal CGreg represents, as already mentioned, the voltage that is effectively applied to the memory cells while the CGreg is the inverted value of the regulated output voltage.

The essential components of the basic circuit of the invention of FIG. 1 are herein indicated with the same acronyms for facilitating the reading of the circuit. In particular, the ELEVATOR block may be realized as shown by the latch circuit including transistors M6, M7, M8 and M9. Through this level shifting structure a voltage CGreg is applied to the control gate of the nonvolatile memory element MM1. CGreg is a replica of the regulated output voltage Vboost produced by the boost circuit, as effectively applied to the control gate of the cells of the memory matrix. The biasing branch of the load transistor M1 and the complementary transistor M2nat of the sensing branch, has an architecture to ensure their correct functioning and greatly enhances stability at the varying operating conditions of the circuit.

In particular, the stability of the bias voltage VTN can be greatly improved by using a plurality of n-channel transistors, connected in parallel, to allow a certain trimming. Moreover, a further element of nonvolatile memory MM2, also biased at the CGreg voltage may be included in the biasing chain (connected in series to an nth natural or low threshold n-channel transistor M5nat), to further stabilize the voltage on the VTN node in such a way that it does not exhibit an excessive variability as a function of the actual threshold values of the n-channel transistors. In fact, it is important that the bias voltage VTN be as stable as possible because its instability, in view of the fact that it determines the bias of the drain node of the nonvolatile memory element MM1 of the sensing branch, would cause a certain drift of the level of the regulated voltage Vboost, that is, of the CGreg voltage applied to the control gate of the memory cells.

A further refinement introduced in the embodiment of FIG. 2 is represented by the use of a second n-channel transistor M3bis, OR-connected to the enabling switch M3 of the biasing branch. It serves to obviate the fact that the voltage drop through M3 could, under conditions of low voltage supply, jeopardize the correct functioning of the circuit. The M10 switch serves to discharge the VTN node following to a stop or disabling command REGdw of the boost circuit.

The pass-gate PG, controlled by the pair of control signals BOOSTdet and BOOSTdetn, serves to transfer the command REGup on the gate of a p-channel transistor M1bis, OR-connected to the p-channel M1 transistor of the sensing branch, in order to maintain the regulation signal REF at a high logic state when the circuit is put in stand-by. This allows an immediate pumping of electric charge at the very instant the boost circuit is again commanded into operation.

The capacitances C2 and C3 have a stabilizing function whereas the capacitance C1 serves to avoid that, following a disabling command REGdw, the node VTPnat may raise toward the supply voltage due to the leaking of current through the relative junction of the natural p-channel transistor. The capacitance C1 also ensures in this case that the REG output remains high for an immediate functionality of the boost circuit following a subsequent enabling command. Finally, the N+ diffusion connected to the VTPnat node provides a leakage capacitance toward ground in order to discharge the node when switching the circuit off.

The circuit of the invention ensures a substantial independence from the variations of the supply voltage, an absence of current absorption from the Vboost line by the regulation circuit, optimal characteristics of regulation directly linked to the actual electrical characteristics of the integrated structures, and a direct monitoring of the Vboost voltage (elimination of multiplying effects in reference voltage generators). Basically the circuit allows for the equilibrium level to track in the most adequate manner the changes induced by modifications of the process parameters (poly length, width "w" of the transistors, thickness of oxides, mobility of the electric charges etc.), or consequent to technological changes (capacitive couplings among logic layers, etc.).

I claim:

1. A regulator circuit for an output voltage produced by a voltage boost circuit, and capable of generating a hysteretic control logic signal for the boost circuit, said regulator circuit comprising:

a sensing branch comprising at least one inverting stage and a nonvolatile memory element functionally connected in series with said at least one inverting stage and between two supply nodes, said at least one inverting stage including an enhanced threshold load transistor of a first conductivity type and a complementary natural transistor connected thereto;

a biasing branch enabled by a start signal of the boost circuit and being capable of generating a first voltage higher than a threshold voltage of said enhanced threshold load transistor and a second voltage higher than a threshold voltage of said complementary natural transistor;

means enabled by the start signal of the boost circuit for applying to a control terminal of said nonvolatile memory element a voltage representative of a regulated output voltage produced by the boost circuit; and one or more inverters coupled in cascade to said at least one inverting stage.

2. A regulator circuit according to claim 1, wherein said biasing branch comprises:

a first diode-configured natural transistor of the first conductivity type coupled between a supply node and a drive node of said enhanced threshold load transistor;

at least one second diode-configured complementary transistor functionally coupled between the other supply node and a drive node of said complementary natural transistor; and at least one switch driven by the start signal capable of connecting the drive nodes of said enhanced threshold load transistor and said complementary natural transistor.

3. A regulator circuit according to claim 1, wherein said means enabled by the start signal of the boost circuit comprises, a latch circuit comprising:

a pair of input transistors driven respectively by the start signal and by an inverted or stop signal; and a pair of cross-coupled complementary load transistors functionally connected to said pair of input transistors and also connected to the regulated output voltage produced by the boost circuit;

a gate node of a complementary load transistor for an input transistor of said pair of input transistors that being driven by said start signal is connected to a drain node of the other input transistor of said pair of input transistors and being connected to a control gate of said nonvolatile memory element.

4. A regulator circuit according to claim 2, wherein said at least one second diode-configured complementary transistor comprises a plurality of transistors connected in parallel.

5. A regulator circuit according to claim 4, further comprising a second nonvolatile memory element connected in series with at least one of said plurality of transistors connected in parallel; and wherein said second nonvolatile memory element comprises a control terminal to which is applied a voltage representative of the regulated output voltage produced by the boost circuit.

6. A regulator circuit according to claim 2, further comprising a second switch being OR-connected to said at least one switch driven by the start signal between the drive node of said natural transistor of said at least one inverting stage and the supply node; and wherein said second switch is driven by the voltage representative of the regulated output voltage produced by the boost circuit.

7. A regulator circuit according to claim 1, further comprising means for maintaining an analog regulation signal of the output node of said inverting stage of said sensing branch at a high logic state during a stand-by phase.

8. A regulator circuit for an output voltage produced by a voltage boost circuit, and capable of generating a hysteretic control logic signal for the boost circuit, said regulator circuit comprising:

a sensing branch comprising at least one inverting stage and a nonvolatile memory element functionally connected in series with said at least one inverting stage and between two supply nodes, said at least one inverting stage including an enhanced threshold load transistor of a first conductivity type and a complementary natural transistor connected thereto;

a biasing branch enabled by a start signal of the boost circuit and being capable of generating a first voltage higher than a threshold voltage of said enhanced threshold load transistor and a second voltage higher than a threshold voltage of said complementary natural transistor, said biasing branch comprising a first diode-configured natural transistor of the first conductivity type coupled between a supply node and a drive node of said enhanced threshold load transistor, and at least one second diode-configured complementary transistor functionally coupled between the other supply node and a drive node of said natural complementary transistor of said at least one inverting stage;

means enabled by the start signal for applying to a control terminal of said nonvolatile memory element a voltage representative of a regulated output voltage produced by the boost circuit; and one or more inverters coupled in cascade to said at least one inverting stage.

9. A regulator circuit according to claim 8, wherein said biasing branch further comprises at least one switch driven by the start signal capable of connecting the drive nodes of said enhanced threshold load transistor and said complementary natural transistor.

10. A regulator circuit according to claim 8, wherein said means enabled by the start signal comprises a latch circuit comprising:

a pair of input transistors driven respectively by the start signal and by an inverted or stop signal; and a pair of cross-coupled complementary load transistors functionally connected to said pair of input transistors and also connected to the regulated output voltage produced by the boost circuit;

a gate node of a complementary load transistor for an input transistor of said pair of input transistors that is driven by said start signal being connected to a drain node of the other input transistor of said pair of input transistors and being connected to a control gate of said nonvolatile memory element.

11. A regulator circuit according to claim 8, wherein said at least one second diode-configured complementary transistor comprises a plurality of transistors connected in parallel.

12. A regulator circuit according to claim 11, further comprising a second nonvolatile memory element connected in series with at least one of said plurality of transistors connected in parallel; and wherein said second nonvolatile memory element comprises a control terminal to which is applied a voltage representative of the regulated output voltage produced by the boost circuit.

13. A regulator circuit according to claim 9, further comprising a second switch being OR-connected to said first at least one switch driven by the start signal between the drive node of said natural transistor of said at least one inverting stage and the supply node; and wherein said second switch is driven by the voltage representative of the regulated output voltage produced by the boost circuit.

14. A regulator circuit according to claim 8, further comprising means for maintaining an analog regulation signal of the output node of said at least one inverting stage of said sensing branch at a high logic state during a stand-by phase.

* * * * *

UNITED STATES PATENT AND TRADEMARK OFFICE
CERTIFICATE OF CORRECTION

PATENT NO. : 5,821,806
DATED : October 13, 1998
INVENTOR(S) : Luigi Pascucci

It is certified that error appears in the above-identified patent and that said Letters Patent is hereby corrected as shown below:

ON THE TITLE PAGE:

Item [73] Assignee:   Strike:

"Agrate Brianza"

Insert:

-- Agrate Brianza, Italy --

Signed and Sealed this

Twentieth Day of April, 1999

Attest:

Q. TODD DICKINSON

*Attesting Officer*      *Acting Commissioner of Patents and Trademarks*